United States Patent
Saia et al.

(10) Patent No.: US 6,935,792 B2
(45) Date of Patent: Aug. 30, 2005

(54) OPTOELECTRONIC PACKAGE AND FABRICATION METHOD

(75) Inventors: Richard Joseph Saia, Niskayuna, NY (US); Thomas Bert Gorczyca, Schenectady, NY (US); Christopher James Kapusta, Duanesburg, NY (US); Ernest Wayne Balch, Ballston Spa, NY (US); Glenn Scott Claydon, Wynantskill, NY (US); Samhita Dasgupta, Niskayuna, NY (US); Eladio Clemente Delgado, Burnt Hills, NY (US)

(73) Assignee: General Electric Company, Niskayuna, NY (US)

( * ) Notice: Subject to any disclaimer, the term of this patent is extended or adjusted under 35 U.S.C. 154(b) by 341 days.

(21) Appl. No.: 10/065,460

(22) Filed: Oct. 21, 2002

(65) Prior Publication Data

US 2004/0076382 A1 Apr. 22, 2004

(51) Int. Cl.$^7$ ................................................ G02B 6/00
(52) U.S. Cl. ......................................................... 385/92
(58) Field of Search ........................... 385/5, 8, 39, 47, 385/55, 92, 94, 129

(56) References Cited

U.S. PATENT DOCUMENTS

| | | | |
|---|---|---|---|
| 5,353,498 A | | 10/1994 | Fillion et al. |
| 5,428,704 A | * | 6/1995 | Lebby et al. ................. 385/92 |
| 5,533,151 A | * | 7/1996 | Leonard .......................... 385/3 |
| 5,854,866 A | * | 12/1998 | Leonard ........................ 385/39 |
| 5,900,674 A | | 5/1999 | Wojnarowski et al. |
| 5,932,387 A | * | 8/1999 | Yamamoto et al. ....... 430/111.1 |
| 6,046,410 A | | 4/2000 | Wojnarowski et al. |
| 6,236,774 B1 | * | 5/2001 | Lackritz et al. ............... 385/14 |
| 6,293,688 B1 | | 9/2001 | Deacon |
| 6,517,995 B1 | * | 2/2003 | Jacobson et al. ........... 430/320 |
| 2002/0019305 A1 | | 2/2002 | Wu |
| 2002/0028045 A1 | | 3/2002 | Yoshimura et al. |
| 2002/0031297 A1 | | 3/2002 | Forrest et al. |
| 2002/0039464 A1 | | 4/2002 | Yoshimura et al. |

FOREIGN PATENT DOCUMENTS

JP           2000235127              8/2000

OTHER PUBLICATIONS

Semiconductor International Website on Flip– Chip Packaging, 5 pages, URL: http://www.e–insite.net/semiconductor/ index.asp? layout=article& articleid= CA2 39576& pub . . . .

U.S. Appl. No. 10/064,581, filed Jul. 29, 2002 Entitled "Method and Apparatus for Fabricating Waveguides and Waveguides Fabricated Therefrom" By L. Douglas, et al.

Y. S. Liu, et al, "Optoelectronic Packaging and Polymer Waveguides for Multichip Module and Board–Level Optical Interconnect Applications", 1995 IEEE, pp. 185–188.

Y. S. Liu, et al, "Optoelectronic Packaging and Polymer Waveguides for Multichip Module and Board–Level Optical Interconnect Applications", 1995 IEEE, pp. 185–188.

A Copy of PCT Search Report Dated May 4, 2004 is enclosed.

* cited by examiner

Primary Examiner—Daniel St.Cyr
(74) Attorney, Agent, or Firm—Ann M. Agosti; Patrick K. Patnode

(57) ABSTRACT

An optoelectronic package is fabricated by a method which includes: positioning an optical device within a window of a substrate active-side up and below a top substrate surface; filling the window with an optical polymer material; planarizing surfaces of the optical polymer material and the substrate; patterning waveguide material over the optical polymer material and the substrate to form an optical interconnection path; and to form a mirror to reflect light from the optical device to the interconnection path; and forming a via to expose a bond pad of the optical device.

66 Claims, 10 Drawing Sheets

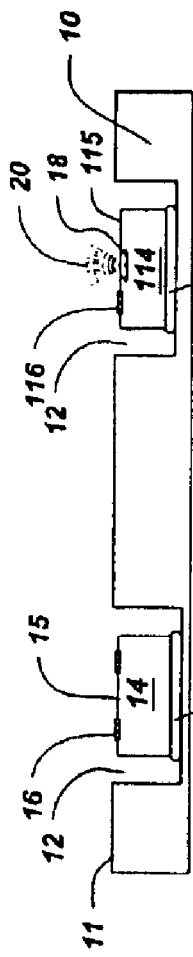
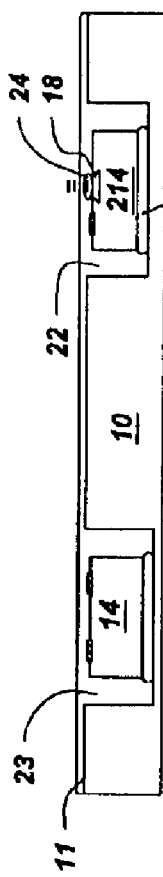
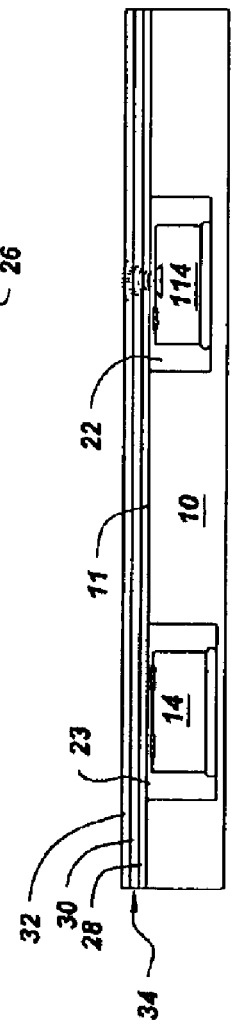
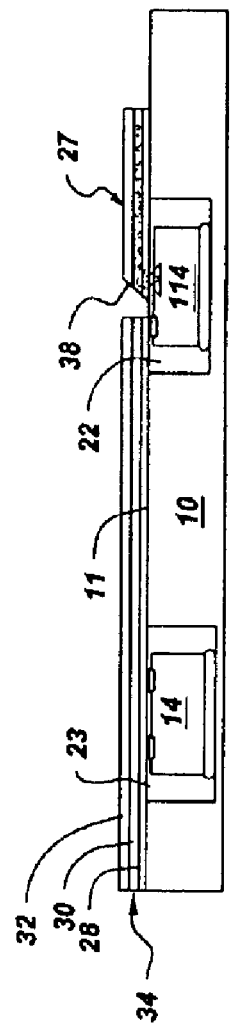
Fig. 1
Fig. 2
Fig. 3
Fig. 4

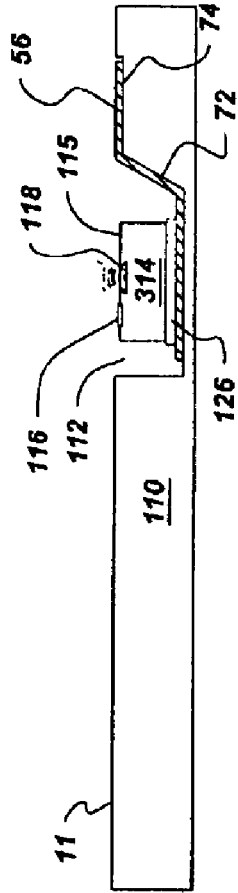
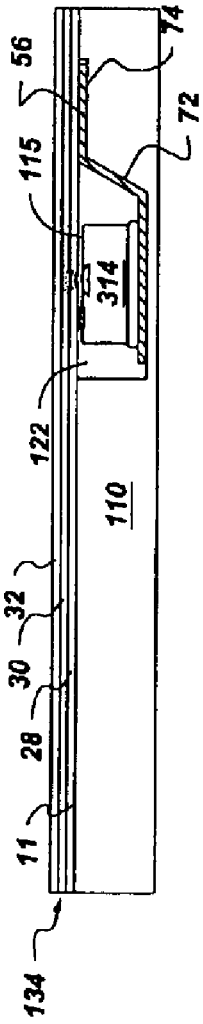
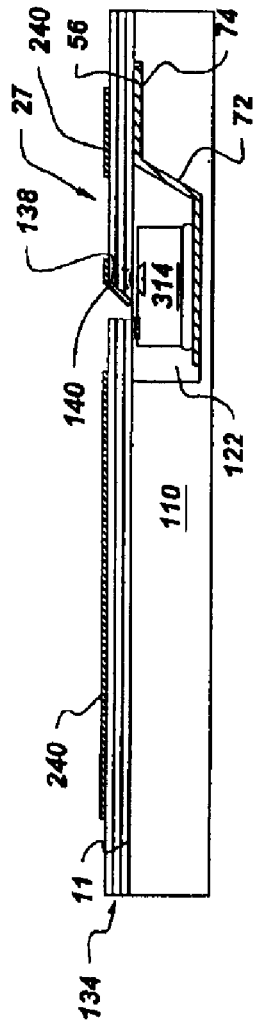
Fig. 11
Fig. 12
Fig. 13
Fig. 14

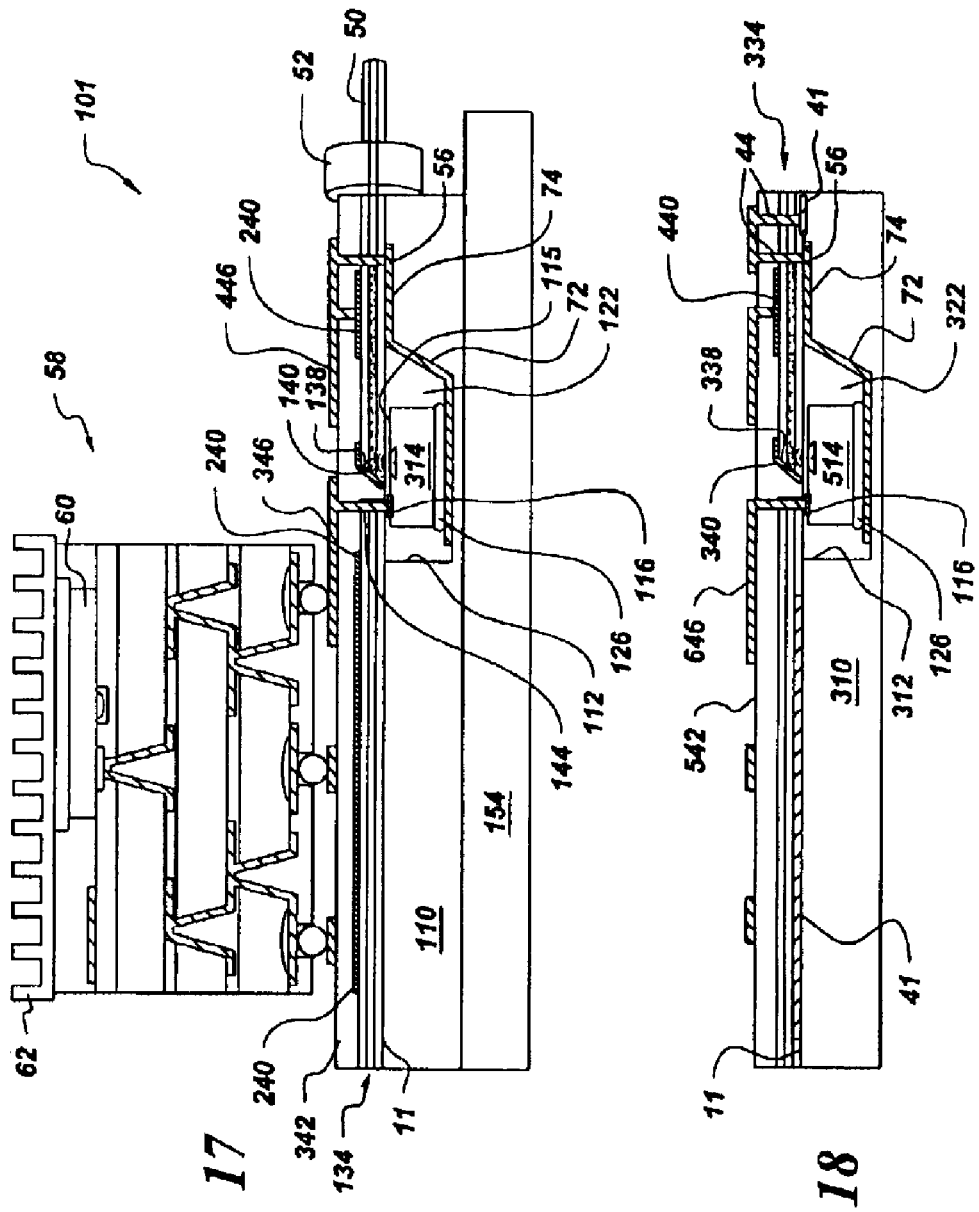

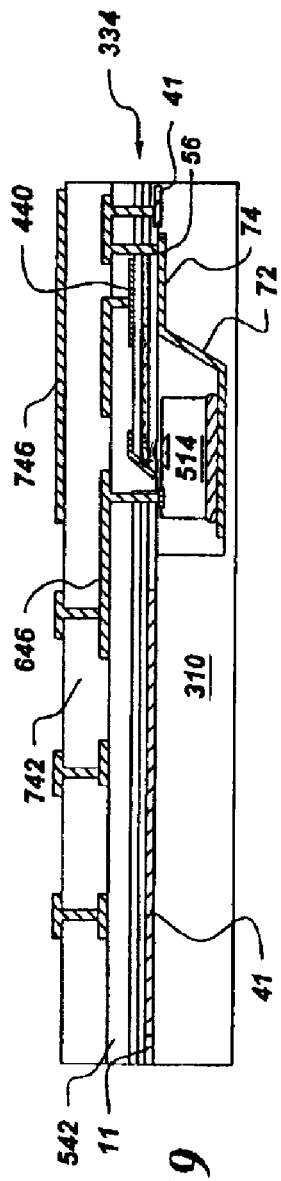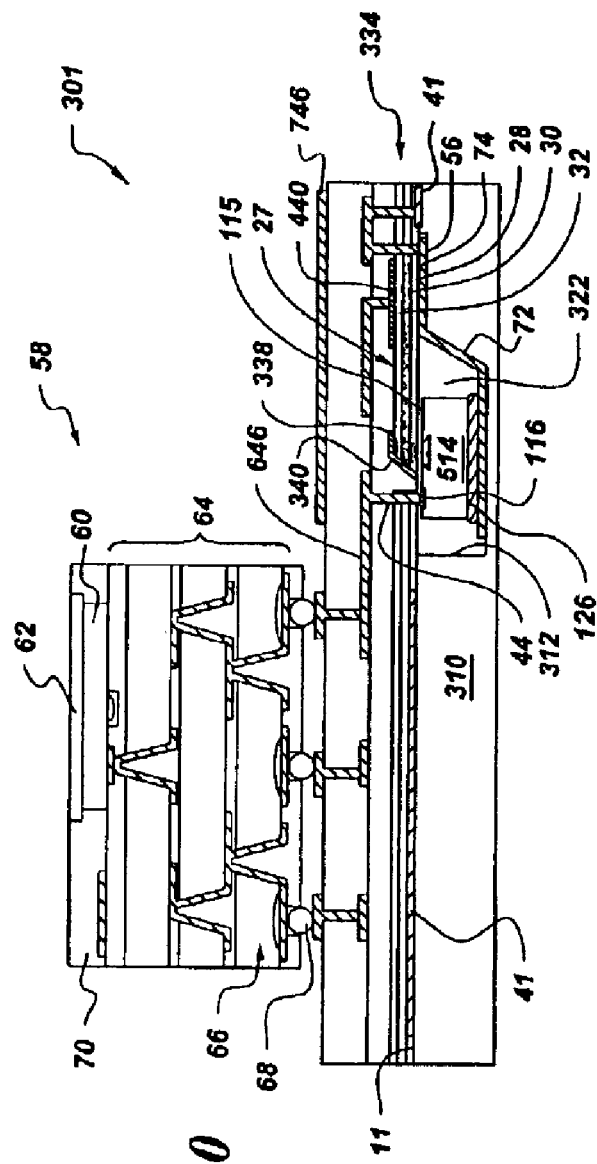
Fig. 19
Fig. 20

OPTOELECTRONIC PACKAGE AND FABRICATION METHOD

CROSS REFERENCE TO RELATED APPLICATIONS

This application is related to commonly assigned U.S. patent application Ser. No. 10/064,581, filed 29 Jul. 2002, entitled "Method and Apparatus for Fabricating Waveguides and Waveguides Fabricated Therefrom," which is herein incorporated by reference.

BACKGROUND OF INVENTION

Traditional optoelectronic modules include a large number of discrete components such as laser, diodes, fibers, lenses, couplers, electronic driver chips, and signal amplifiers, for example. Each of the different components has different packaging requirements, and efficiently incorporating these different components together in a single module has been a challenge. In single mode waveguide embodiments, for example, optical component attachment typically involves accurate submicron placement (alignment on the order of about 0.25 micrometers) and quick cure adhesives. Conventional methods have included active part alignment with little or no automation which results in high labor costs. Modules are often assembled with a hierarchy of solder materials at different temperatures and wire bonding in very difficult tight spaces. The industry is in need of a low cost automated batch assembly process.

It would therefore be desirable to provide a hybrid integration packaging process which reduces the manual handling of components and provides passive waveguide alignment and which is useful regardless of whether the mode is single mode or multimode. It would additionally be desirable to provide a packaging process which results in a smaller, lighter module with improved high frequency properties.

SUMMARY OF INVENTION

Briefly, in accordance with one embodiment of the present invention, a method of fabricating an optoelectronic package comprises: positioning an optical device within a window of a substrate active-side up and below a top substrate surface; filling the window with an optical polymer material: planarizing surfaces of the optical polymer material and the substrate; patterning waveguide material over the optical polymer material and the substrate to form an optical interconnection path and to form a mirror to reflect light from the optical device to the interconnection path; and forming a via to expose a bond pad of the optical device.

In accordance with another embodiment of the present invention, an optoelectronic package comprises: a substrate; an optical device positioned within a window of the substrate active-side up and below a top substrate surface; an optical polymer material surrounding the optical device within the window and having a planar surface with respect to the top substrate surface; and waveguide material patterned over the optical polymer material and the substrate and forming an optical interconnection path and a mirror configured for reflecting light from the optical device to the interconnection path, the waveguide having a via to expose a bond pad of the optical device.

BRIEF DESCRIPTION OF DRAWINGS

These and other features, aspects, and advantages of the present invention will become better understood when the following detailed description is read with reference to the accompanying drawings in which like characters represent like parts throughout the drawings, wherein:

FIGS. 1–10 are sectional side views illustrating stages in fabrication of an optoelectronic package in accordance with one embodiment of the present invention.

FIGS. 11–17 are sectional side views illustrating stages in fabrication of an optoelectronic package in accordance with another embodiment of the present invention.

FIGS. 18–20 are sectional side views illustrating stages in fabrication of an optoelectronic package in accordance with another embodiment of the present invention.

DETAILED DESCRIPTION

Figure 5:
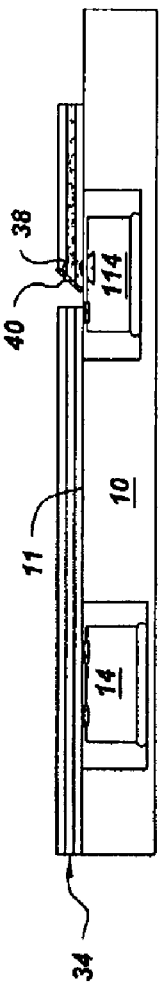
Figure 6:
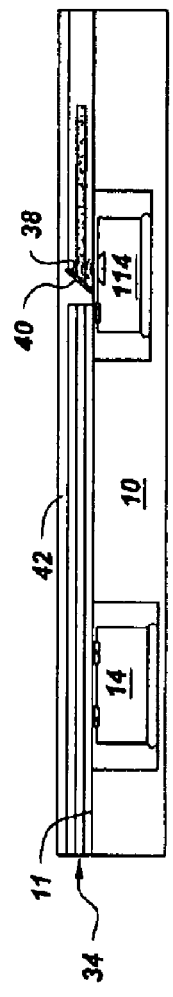
Figure 7:
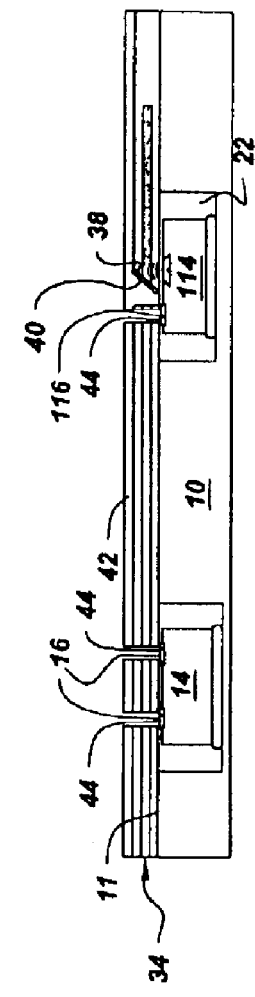
Figure 8:
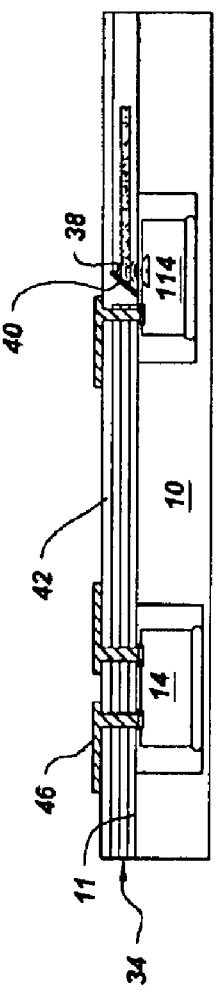

In accordance with one embodiment of the present invention, a method of fabricating an optoelectronic package 1 (FIG. 10), 101 (FIG. 17), 201 (FIG. 23), 301 (FIG. 20) comprises: (a) positioning an optical device 114, 214, 314, 414, 514 (meaning at least one optical device) within a window 12, 112, 212, 312 of a substrate 10 active-side 115 up and below a top substrate surface 11 (FIGS. 1, 12, 18, and 21); (b) filling the window with an optical polymer material 22, 122, 222, 322 (FIGS. 2, 12, 18, and 22); (c) planarizing surfaces of the optical polymer material and the substrate; (d) patterning waveguide material 34, 134, 234, 334 over the optical polymer material and the substrate to form an optical interconnection path 27 (at least one) and to form a mirror 38 (at least one) to reflect light from the optical device to the interconnection path (FIGS. 3–4, 13–14, 18, 22); and (e) forming a via 44 (at least one) to expose a bond pad 116 of the optical device (FIGS. 7, 15, 18, 22).

As used herein "top," "bottom", and other orientation type words are for purposes of example and not intended to limit or have any relation to the particular orientation of a resulting package in the package's operating environment.

Substrate 10 typically comprises a thermally conductive material having a low coefficient of thermal expansion (less than or equal to about 3.5, for example) and having good operating properties at high frequencies (in the range of about 10 GHz to about 40 GHz, for example). Example materials include alumina, aluminum nitride, silicon nitride, and carbon fiber filled epoxy resin. It is further advantageous to use a substantially flat substrate 10 (having height variations which do not exceed about 6 micrometers, for example).

In one embodiment, windows 12 are milled to varying depths which depend upon the thickness of the optical devices 114 and electronic devices 14 (if applicable) to be inserted. In one example, these depths are typically on the order of about 250 micrometers to about 300 micrometers. The thicknesses are typically selected so that the devices can be placed below top substrate surface 111 by at most about 100 micrometers. Although individual windows are shown, multiple devices can be situated in a single window if desired. Additionally, although windows 12 are shown as extending partially through substrate 10, another alternative is to have one or more windows extend completely through the substrate (not shown).

Typically the positioning of optical device 1114 is performed with high precision pick-and-place equipment (not shown). In one embodiment, optical device 114 is attached to substrate 10 with an adhesive 26. Adhesive 26 typically comprises a thermally conductive material and in one embodiment further comprises an electrically conductive material. Solder is particularly useful for conductivity and stability.

Optical device 114 typically comprises a vertical cavity surface emitting laser (for emitting light 20) or a photodetector. Optical polymer material 22 is selected to have an appropriate optical match with respect to optical device 114. In other words, the optical polymer material does not substantially absorb light at the output wavelength (for emitters) or the detection wavelength (for detectors) of the optical device. In one embodiment the surfaces of optical polymer material 22 and substrate 10 are planarized by polishing.

Waveguide material 34 typically comprises core and cladding materials as further described below and may be patterned by any desired technique. For single mode applications adaptive patterning such as by a technique described in aforementioned U.S. patent application Ser. No. 10/064,581 is particularly useful. Mirror 38 is typically formed by creating a desired angle (generally about 45 degrees) of waveguide material 34 over the active portion 18 of optical device 114. Mirror 38 may be fabricated by a conventional stamping or etching: technique. If etching is used, one option is a gray scale mask process described in aforementioned U.S. patent application Ser. No. 10/064,581.

In a related optoelectronic package 1, 101, 201, 301 embodiment, which may be fabricated in the manner described above with respect to the method embodiment, for example, the package comprises: (a) substrate 10; (b) optical device 114 positioned within window 12 active-side 115 up and below a top substrate surface 11; (c) optical polymer material 22 surrounding the optical device within the window and having a planar surface with respect to the top substrate surface; and (d) waveguide material 34 patterned over the optical polymer material and the substrate and forming an optical interconnection path 27 and a mirror 38 configured for reflecting light from the optical device to the interconnection path, the waveguide having a via 44 to expose a bond pad 116 of the optical device. In this embodiment, "surroundings" means surrounding the exposed sides of optical device 114 except for the locations of one or more vias 44.

It is typically advantageous to pattern a protective metallization layer 40 over mirror 38 for protecting the surface of mirror 38 from remaining processing steps and the environment. In one embodiment, protective metallization layer 40 comprises aluminum having a thickness ranging from about 1000 angstroms to about 2000 angstroms.

Additionally, it is typically useful to apply an insulating layer 42 over patterned waveguide material 34. Insulating layer 42, although not required, helps provide dielectric material for improving high frequency properties of the resulting package I. In such embodiments, via 44 is formed through insulating layer 42 extending to bond pad 116. Typically vias 44 are formed by laser drilling, for example. It is further useful to pattern an electrically conductive interconnection layer 46 extending over insulating layer 42 and into via 44. Electrically conductive interconnection layer 46 may comprise conventional interconnection layers such as titanium, copper, and titanium, for example.

Figure 9:
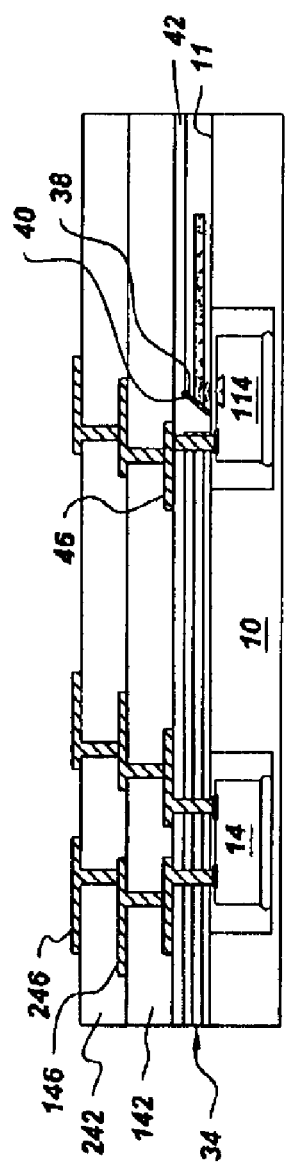
Figure 16:
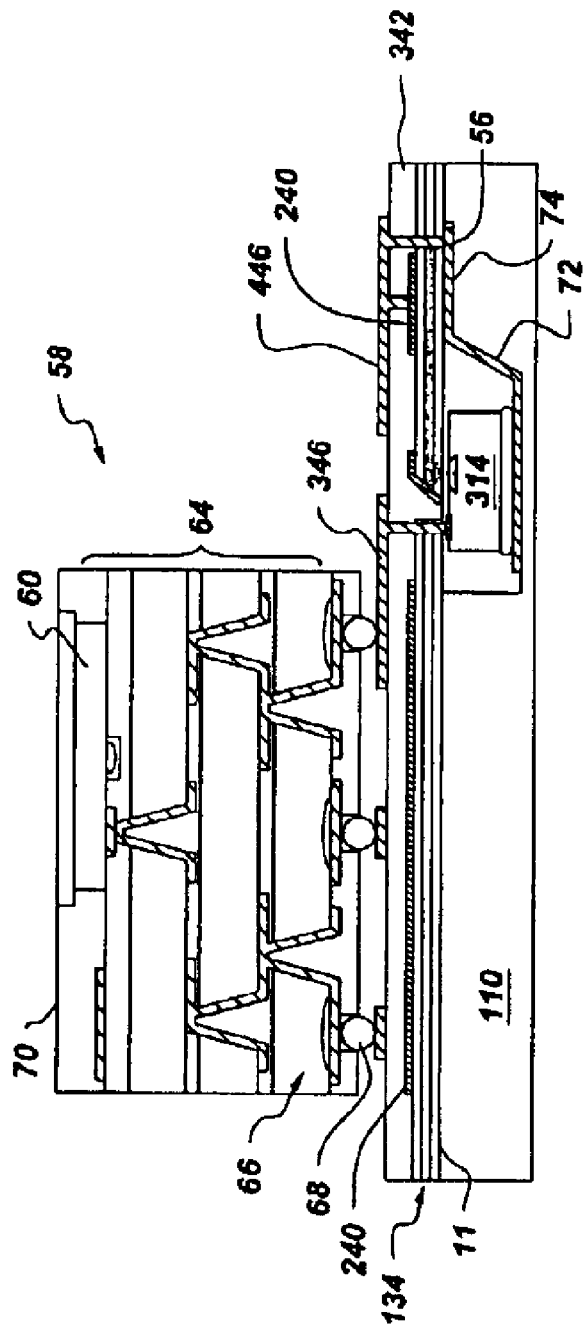

If desired, one or more additional insulating layers 142 and 242 and electrically conductive interconnection layers 146 and 246 can be added to provide additional flexibility in interconnections (FIG. 9). In another embodiment, interconnections to an electronic device 58 (shown as a high frequency drive electronic module 58 in FIG. 16 which may comprise a module such as described in U.S. Pat. No. 5,353,498, for example) are enhanced by a ball 68 grid array arrangement wherein an electronic die 60 of module 58 is situated in a substrate 70 along with a heat sink 62 and coupled by interconnection layers 64 of module 58 to electrically conductive interconnection layer 346. In this embodiment, floating pad structures 66 such as described in commonly assigned U.S. Pat. Nos. 5,900,674 and 6,046,410 can assist in reducing any stress due to coefficient of thermal expansion mismatch. In the ball grid array arrangement, module 58 and the packaged optical device 114 can be tested individually and then assembled to provide higher yield.

Figure 23:
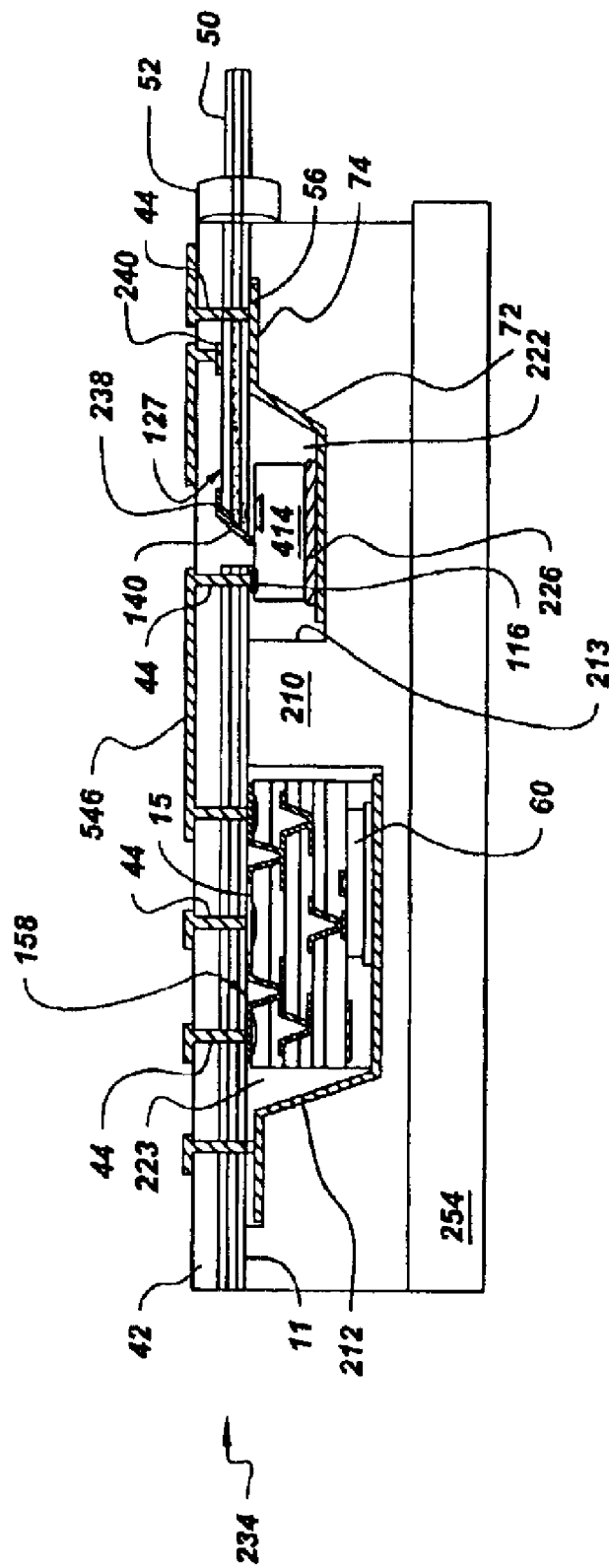
Figure 24:
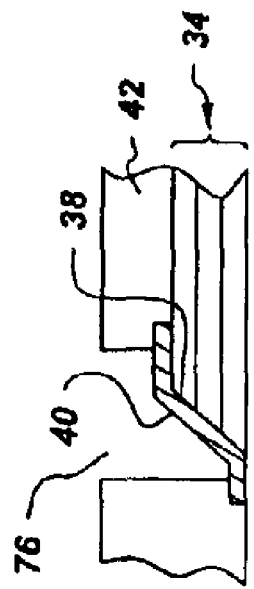
FIGS. 24–26 are sectional side views illustrating partial views of stages in fabrication of an optoelectronic package in accordance with another embodiment of the present invention.
Figure 25:
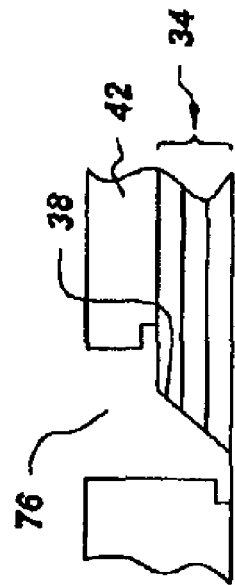
Figure 26:
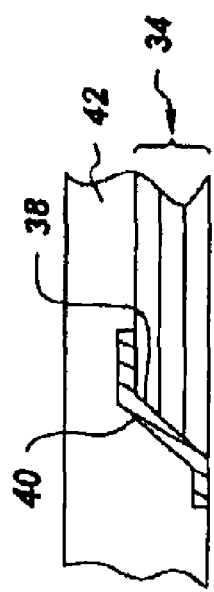

As shown in FIGS. 24–26, in some embodiments where the lower refractive index of air is used to obtain lower loss mirror properties, at least a portion of insulating layer 42 (as well as any overlying insulating layers) extending over the mirror and protective metallization layer 40 is removed (to form an opening 76), and the protective metallization layer is removed from mirror 38. Any insulating layers overlying mirror 38 of material 34 are typically removed by laser ablation, for example. Protective metallization layer 40 is typically removed by standard wet etching techniques, for example. In these embodiments, protective metallization layer 40 acts as a stop for protecting mirror 38 during insulating layer removal. FIGS. 24–26 illustrate close up views of mirror 38 and protective metallization layer 40 before and after material removals. Although the sequence of these material removal acts with respect to the interconnection layer fabrication acts is not critical, it is convenient to perform the material removal prior to the patterning of the outer interconnection layer (layer 246 in FIG. 10 or layer 546 in FIG. 23, for example).

In one embodiment illustrated in FIG. 2, a lens 24 is positioned over an optical device 214 to focus light 20 onto mirror 38.

Typically waveguide material 34 comprises a first layer of cladding material 28 over optical polymer material 22 and substrate 10, a layer of core material 30 over first layer of cladding material 28, and a second layer of cladding material 32 over layer of core material 30. In one embodiment, the cladding material comprises benzocyclobutene (BCB) and the core material comprises a polysulfone, for example. In one embodiment, the surface of waveguide material 34 is substantially planar (does not have height variations exceeding about 6.5 micrometers, for example).

For embodiments wherein optical device 114 has an electrical contact on a surface opposite active side 115, it is useful to provide a substrate 110 comprising a window metallization layer 56 extending at least partially on a bottom surface of the window and top substrate surface 11 (FIG. 11) and to position the optical device so as to at least partially overlie the window metallization layer. In such embodiments, it is particularly useful to use an electrically conductive material as adhesive 126 to attach the optical device and the substrate. In one embodiment, window metallization layer 56 comprises titanium coated by aluminum, for example. In another example embodiment, particularly useful when solder is used as adhesive 126, window metallization layer 56 comprises titanium coated by copper coated by nickel coated by gold.

In such embodiments, it is additionally useful to have a window 112 comprising a tapered ramp 72 extending between optical device 314 and the portion of top substrate surface 11 underlying window metallization layer 56. The ramp is useful for forming a smooth electrical connection between the portions of the window metallization layer on the window and on the top substrate surface.

In an even more specific embodiment, substrate 110 comprises a shallow recess 74 in top substrate surface 11 in which window metallization layer 56 is situated. The recess is useful for allowing the metallization to remain after planarizing optical polymer material 22 and substrate 10 surfaces. Although window metallization layer 56 can be patterned prior to surface planarization, patterning is not necessary because planarization can be used to remove metal from the top surface and leave metal in the recesses.

In addition to or instead of having window metallization layer 56 provide a path for backside die contact, metallization layer 56 may provide a lower metal electrode for a Mach Zender waveguide as can be seen by the example of the portion of metallization layer 56 underlying microstrip reference plane 240 in FIG. 14.

Figure 15:
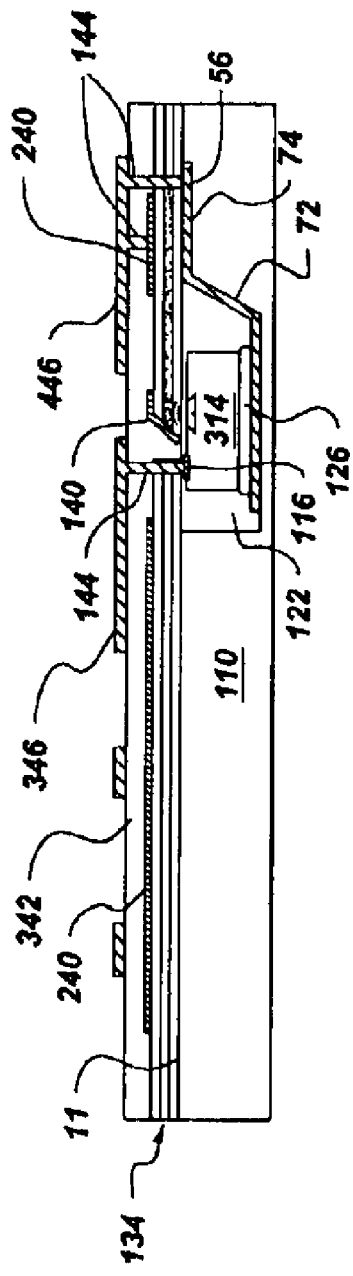

In a more specific embodiment, which may be separate from or combined with the window metallization layer embodiment, microstrip reference plane 240 is patterned over the waveguide material. Typically deposition and patterning of microstrip reference plane 240 is performed simultaneously with that of protective metallization layer 140 over mirror 138. In an even more specific embodiment wherein window metallization layer 56 and microstrip reference plane 240 are both present, a plurality of vias 44 are formed with at least one via extending to microstrip reference plane 240 and at least one via extending to a portion of the window metallization layer 56 situated on top substrate surface 11 (FIG. 15). In a still more specific embodiment, the electrical interconnection is provided by an electrically conductive interconnection layer 346, 446 (FIG. 15) overlying the insulating layer. As described in Gregory Phipps, Flip-Chip Packaging moves into the Mainstream, Semiconductor International, 1 Sep. 2002, microstrip structures typically include a signal conductor over a parallel reference plane separated by a dielectric material and provide benefits of controlled signal impedance, reduced signal cross talk, and reduced signal inductance.

In a more specific embodiment, as shown in FIGS. 19–20, which again may be separate from or combined with the window metallization layer embodiment, substrate 310 comprises a first stripline reference plane 41 patterned thereon, and a second stripline reference plane 746 is patterned over at least a portion of electrically conductive interconnection layer 646 (and insulating layer 742). Typically first stripline reference plane 41 is patterned on substrate 310 after the surfaces of substrate 310 and optical polymer material 322 are planarized. In these embodiments, first stripline reference plane 41 is designed to be thin enough (about 2 micrometers to about 4 micrometers in one example) so as not to interfere with the flatness specification (6.4 micrometers in this example). As described in aforementioned Gregory Phipps, Flip-Chip Packaging moves into the Mainstream, stripline structures typically include a signal conductor layer sandwiched between two reference plane layers on the top and bottom with dielectric layer between each combination of signal conductor and reference plane layers and provide benefits of high speed signal transmission, reduced cross talk and noise coupling, and good signal coupling.

In a related stripline embodiment which may be used in addition or instead of the embodiment with the first stripline reference plane 41 on the substrate, a first stripline reference plane 440 is patterned on the waveguide material.

In an even more specific embodiment a plurality of vias 44 are formed with at least one via extending to first stripline metallization layer 41 and at least one via extending to a portion of window metallization layer 56 situated on the top substrate surface.

Figure 21:
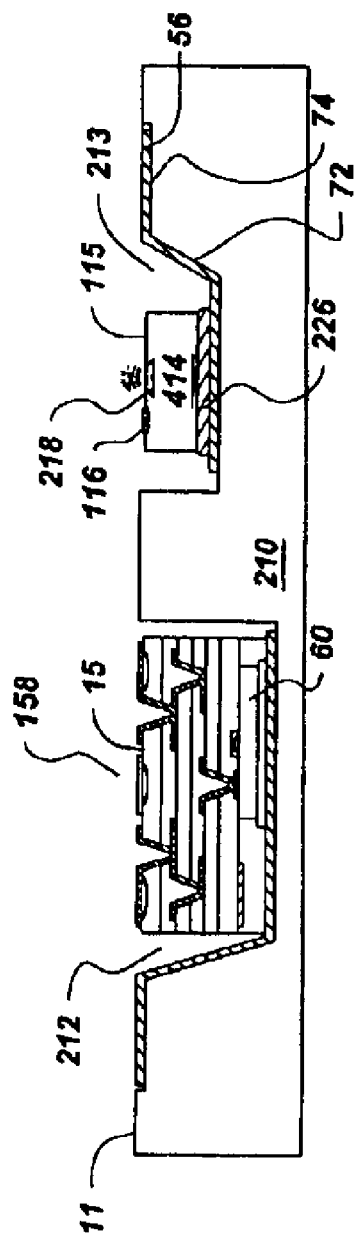
FIGS. 21–23 are sectional side views illustrating stages in fabrication of an optoelectronic package in accordance with another embodiment of the present invention.

In another embodiment, as shown in FIGS. 1–10 for example, the optoelectronic package further includes an electronic device 14 (at least one) positioned within the at least one window 12 of the substrate 10 active-side 15 up, and vias 44 expose bond pads 16 of the electronic device. In this embodiment, the exposed bond pads of the electronic and optical devices are electrically interconnected. In a more specific embodiment, insulating layer 42 is applied over the patterned waveguide material, and an electrically conductive interconnection layer 46 extends over the insulating layer and into the vias to provide the electrical interconnections. In another more specific embodiment, a heat sink 54 is attached to a surface of the substrate opposite the top substrate surface. One non-limiting example of a heat sink is a thermoelectric cooler. Electronic device 14 may comprise either a single chip (FIG. 1) or a multichip module 158 (FIG. 21).

Figure 10:
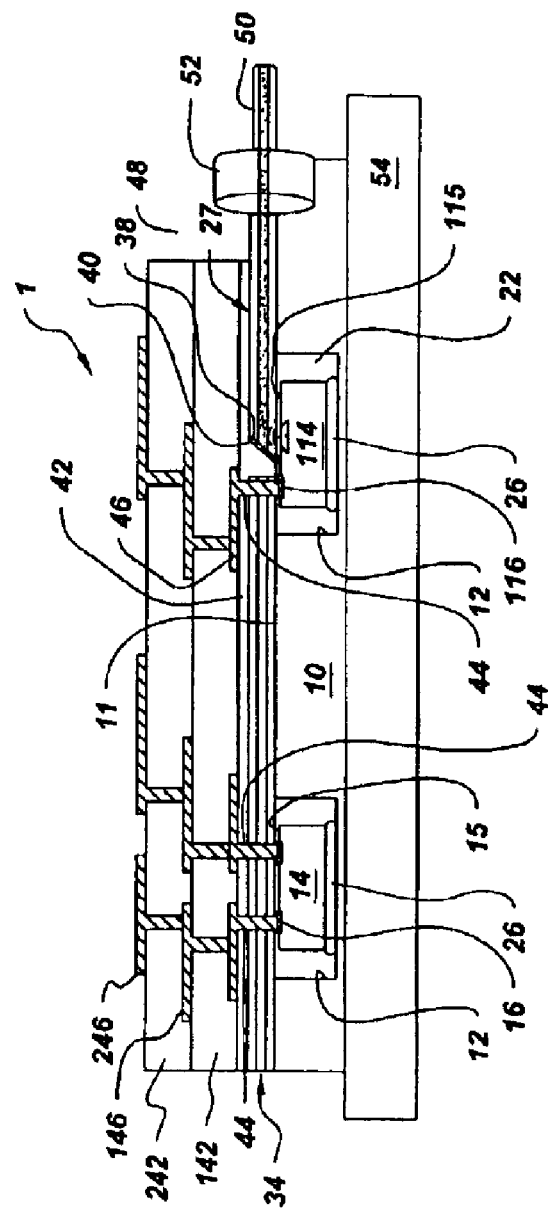

In another embodiment a portion 48 of the insulating layer is removed to expose the patterned waveguide material and an optical fiber 50 is attached to the exposed patterned waveguide material by an optical connector 52 (FIG. 10). Alignment of the fiber can be accomplished, for example, by using standard active processes or by using passive processes such self-aligned solder connection techniques or MEMS alignment techniques (not shown).

The above embodiments have been described generally and can be combined in any one of a number of suitable combinations. Several exemplary combinations are described below but are not intended to be limiting.

FIGS. 1–10 are sectional side views illustrating stages in fabrication of an optoelectronic package in accordance with one embodiment of the present invention wherein an optoelectronic package 1 comprises: (a) a substrate 10 having windows 12; (b) an optical device 114 positioned within a first window 12 of the substrate active-side 115 up and below a top substrate surface 1; (c) an electronic device 14 positioned within a second window of the substrate active-side up 15 and below the top substrate surface; (d) an optical polymer material 22 surrounding the optical device within the first window and having a planar surface with respect to the top substrate surface; (e) filler material 23 surrounding the electrical device within the second window and having a planar surface with respect to the top substrate surface; (f) waveguide material 34 patterned over the optical polymer material, filler material, and the substrate and forming an optical interconnection path 27 and a mirror 38 configured for reflecting light from the optical device to the interconnection path; (g) an insulating layer 42 over the patterned waveguide material, the insulating layer and waveguide material having vias 44 extending therethrough towards bond pads of the electrical and optical devices; and (h) an electrically conductive interconnection layer 46 extending over the insulating layer and into the vias. As described above, it is generally advantageous to further include a protective metallization layer 40 over the mirror. Alternatively, it is advantageous to include an opening 76 in the insulating layer exposing at least a portion of the mirror.

Although not required (because optical properties of the material over the electrical device are not important), typically filler material 23 is the same material as optical material 22. Additional useful features which are also described above include window metallization layer 56 and microstrip reference plane 240. Other useful features include heat sink 54 attached to a surface of the substrate opposite the top substrate surface and having the electronic device comprise a multichip module 158.

FIGS. 11–17 are sectional side views illustrating stages in fabrication of an optoelectronic package in accordance with another embodiment of the present invention wherein an optoelectronic package 101 comprises: (a) a substrate 110 having a window 112 and comprising a window metallization layer 56 extending at least partially on a bottom surface of the window; and a top substrate surface 11; (b) an optical device 314 positioned within the window active-side 115 up and below the top substrate surface at least partially overlying the window metallization layer; (c) an optical polymer material 122 surrounding the optical device within the window and having a planar surface with respect to the top substrate surface; (d) waveguide material 134 patterned over the optical polymer material and the substrate and forming an optical interconnection path 27 and a mirror 138 configured for reflecting light from the optical device to the interconnection path; (e) a microstrip reference plane 240 over the waveguide material; (f) an insulating layer 342 over the waveguide material and microstrip reference plane, the insulating layer and waveguide material having vias 144 extending therethrough towards bond pads of the electrical and optical devices, the window metallization layer, and the microstrip reference plane; and (g) an electrically conductive interconnection layer 346, 446 extending over the insulating layer and into the vias. As described above, it is generally advantageous to further include a protective metallization layer 40 over the mirror. Alternatively, it is advantageous to include an opening 76 in the insulating layer exposing at least a portion of the mirror.

An additional useful feature which is also described above include a solder 126 configured for coupling the optical device and the substrate. Other example useful features include the electrically conductive interconnection layer 446 coupling the microstrip reference plane and the substrate window metallization layer as well as heat sink 154 and heat sink 62. (FIG. 17).

FIGS. 18–20 are sectional side views illustrating stages in fabrication of an optoelectronic package in accordance with another embodiment of the present invention wherein an optoelectronic package 301 comprises: (a) a substrate 310 having a window 312 and comprising a window metallization layer 56 extending at least partially on a bottom surface of the window and a top substrate surface 11 and a first stripline reference plane 41 patterned on the substrate; (b) an optical device 114 positioned within the window active-side 115 up and below the top substrate surface at least partially overlying the window metallization layer; (c) an optical polymer material 322 surrounding the optical device within the window and having a planar surface with respect to the top substrate surface; (d) waveguide material 334 patterned over the optical polymer material and the substrate and forming an optical interconnection path 27 and a mirror 338 configured for reflecting light from the optical device to the interconnection path; (e) an insulating layer 542 over the waveguide material, the insulating layer and waveguide material having vias 44 extending therethrough towards bond pads of the electrical and optical devices, the window metallization layer, and the first stripline reference plane; and (f) an electrically conductive interconnection layer 646 extending over the insulating layer and into the vias; and (g) a second stripline metallization layer 746 patterned over the electrically conductive interconnection layer.

As described above, it is generally advantageous to further include a protective metallization layer 340 over the mirror. If a portion of first stripline reference plane 440 is situated over the waveguide material, typically protective metallization layer 340 will be the same material as first stripline reference plane 440. Alternatively, it is advantageous to include an opening 76 in the insulating layer exposing at least a portion of the mirror.

An additional useful feature which is also described above include a solder 126 configured for coupling the optical device and the substrate. Other example useful features include the substrate window metallization layer as well as heat sink 54 (FIG. 10) and/or heat sink 62 (FIG. 20).

Figure 22:
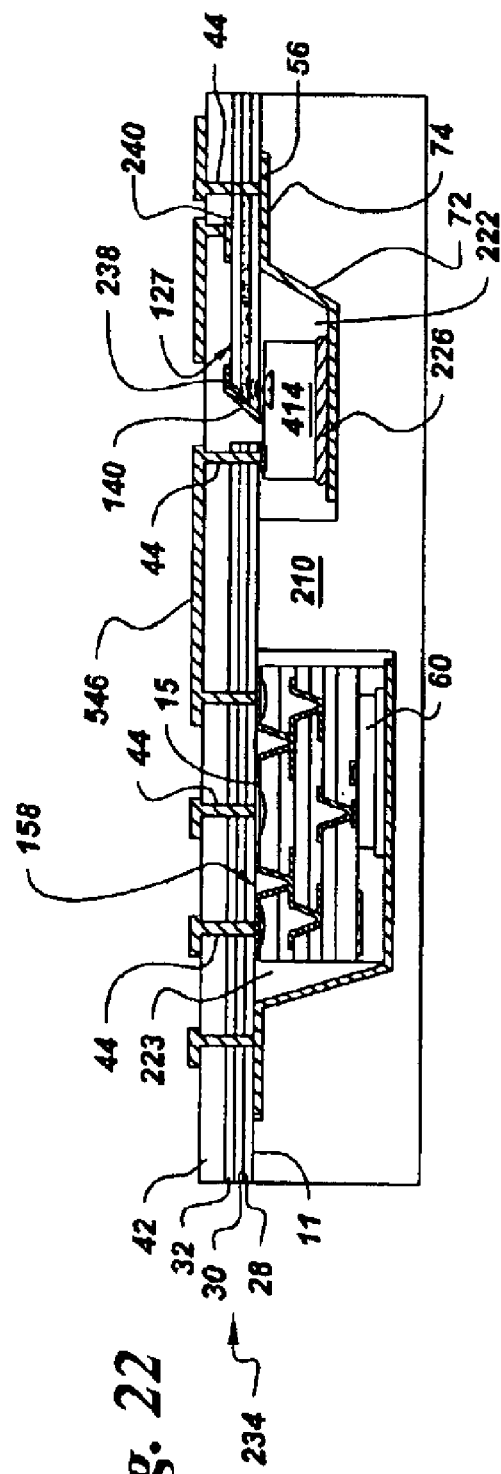

FIGS. 21–23 are sectional side views illustrating stages in fabrication of an optoelectronic package in accordance with another embodiment of the present invention wherein an optoelectronic package 201 comprises: (a) a substrate 210 having windows, a first window 213 having a window metallization layer 56 extending at least partially on a bottom surface of the first window and a top substrate surface 111; (b) an optical device 414 positioned within the first window active-side 115 up and below the top substrate surface at least partially overlying the window metallization layer; (c) a multichip module 158 positioned within a second window 212 of the substrate active-side up and below the top substrate surface; (d) an optical polymer material 222 surrounding the optical device within the first window and having a planar surface with respect to the top substrate surface; (e) filler material 223 surrounding the electrical device within the second window and having a planar surface with respect to the top substrate surface; (f) waveguide material 234 patterned over the optical polymer material, filler material, and the substrate and forming an optical interconnection path 27 and a mirror 238 configured for reflecting light from the optical device to the interconnection path; (g) a microstrip reference plane 240 over the waveguide material: (h) an insulating layer 242 over the patterned waveguide material and the microstrip reference plane, the insulating layer and waveguide material having vias 44 extending therethrough towards bond pads of the multichip module and the optical device, the window metallization layer, and the microstrip reference plane; and (i) an electrically conductive interconnection layer 546 extending over the insulating layer and into the vias. As described above, it is generally advantageous to further include a protective metallization layer 140 over the mirror. Alternatively, it is advantageous to include an opening 76 in the insulating layer exposing at least a portion of the mirror.

Additional useful features which are also described above include heat sink 54 and solder 26 configured for coupling the optical device and the substrate.

The embodiment of FIGS. 21–23 does not involve ball grid array attachment and results in a smaller more compact integrated module.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method of fabricating an optoelectronic package comprising:
   (a) positioning an optical device within a window of a substrate active-side up and below a top substrate surface;

(b) filling the window with an optical polymer material;
(c) planarizing surfaces of the optical polymer material and the substrate;
(d) patterning waveguide material over the optical polymer material and the substrate to form an optical interconnection path and to form a mirror to reflect light from the optical device to the interconnection path; and
(e) forming a via to expose a bond pad of the optical device.

2. The method of claim 1 further comprising patterning a protective metallization layer over the mirror.

3. The method of claim 2 further comprising, after (d) and before (e), applying an insulating layer over the patterned waveguide material, wherein (e) comprises forming the via through the insulating layer extending to the bond pad, and further comprising (f) patterning an electrically conductive interconnection layer extending over the insulating layer and into the via.

4. The method of claim 3 wherein (d) comprises applying a first layer of cladding material over the optical polymer material and the substrate, applying a layer of core material over the first layer of cladding material, applying a second layer of cladding material over the layer of core material, and patterning the first layer of cladding material, the layer of core material, and the second layer of cladding material to form an angle of about 45 degrees.

5. The method of claim 3 further comprising, prior to (a), providing a substrate comprising a window metallization layer extending at least partially on a bottom surface of the window and the top substrate surface and wherein (a) comprises positioning the optical device so as to at least partially overly the window metallization layer.

6. The method of claim 5 wherein the window comprises a tapered ramp extending between the optical device and the portion of the top substrate surface underlying the window metalization layer.

7. The method of claim 6 wherein the substrate comprises a shallow recess in the top substrate surface in which the window metallization layer is situated.

8. The method of claim 7 wherein (c) further comprises removing excess window metallization material from the top substrate surface.

9. The method of claim 5 wherein (a) comprises using a material comprising a solder.

10. The method of claim 5 further comprising, prior to applying the insulating layer, patterning a microstrip reference plane over the waveguide material.

11. The method of claim 10 wherein (e) comprises forming a plurality of vias with at least one via extending to the microstrip metalization layer and at least one via extending to a portion of the window metallization layer situated on the top substrate surface.

12. The method of claim 5 further comprising providing a first stripline reference plane on the waveguide material, and further comprising patterning a second stripline reference plane over at least a portion of the electrically conductive interconnection layer.

13. The method of claim 5 wherein (a) comprises providing a substrate comprising a first stripline reference plane patterned thereon, and further comprising patterning a second stripline reference plane over at least a portion of the electrically conductive interconnection layer.

14. The method of claim 13 wherein (e) comprises forming a plurality of vias with at least one via extending to the first stripline reference plane and at least one via extending to a portion of the window metallization layer situated on the top substrate surface.

15. The method of claim 3 further comprising removing at least a portion of the insulating layer extending over the mirror and the protective metallization layer, and removing the protective metallization layer from the mirror.

16. The method of claim 1 wherein (a) comprises positioning an electronic device within the at least one window of the substrate active-side up, wherein (e) comprises forming vias to expose bond pads of the electronic device, and further comprising (f) electronically interconnecting the exposed bond pads of the electronic and optical devices.

17. The method of claim 16 further comprising, after (d) and before (e), applying an insulating layer over the patterned waveguide material, wherein (e) comprises forming the vias through the insulating layer extending to the bond pads, and wherein (f) comprises patterning an electrically conductive interconnection layer extending over the insulating layer and into the vias.

18. The method of claim 17 further comprising attaching a heat sink to a surface of the substrate opposite the top substrate surface.

19. The method of claim 18 wherein the electronic device comprises a multichip module.

20. An optoelectronic package comprising:
(a) a substrate;
(b) an optical device positioned within a window of the substrate active-side up and below a top substrate surface;
(c) an optical polymer material surrounding the optical device within the window and having a planar surface with respect to the top substrate surface; and
(d) waveguide material patterned over the optical polymer material and the substrate and forming an optical interconnection path and a mirror configured for reflecting light from the optical device to the interconnection path, the waveguide having a via to expose a bond pad of the optical device.

21. The package of claim 20 further comprising a protective metallization layer over the mirror.

22. The package of claim 20 further comprising, an insulating layer over the patterned waveguide material, the insulating layer having the via extending therethrough towards the bond pad, and an electrically conductive interconnection layer extending over the insulating layer and into the via.

23. The package of claim 22 further comprising an opening in the insulating layer exposing at least a portion of the mirror.

24. The package of claim 22 wherein the patterned waveguide material comprises a first layer of cladding material over the optical polymer material and the substrate, a layer of core material over the first layer of cladding material, and a second layer of cladding material over the layer of core material.

25. The package of claim 22 wherein the substrate comprises a window metallization layer extending at least partially on a bottom surface of the window and the top substrate surface and wherein the optical device at least partially overlies the window metallization layer.

26. The package of claim 25 wherein the window comprises a tapered ramp extending between the optical device and the portion of the top substrate surface underlying the window metalization layer.

27. The package of claim 26 wherein the substrate comprises a shallow recess in the top substrate surface in which the window metallization layer is situated.

28. The package of claim 25 further comprising a solder configured for coupling the optical device and the substrate.

29. The package of claim 25 further comprising a microstrip reference plane over the waveguide material.

30. The package of claim 29 wherein the insulating layer has a plurality of vias with at least one via extending to the microstrip reference plane and at least one via extending to a portion of the window metallization layer situated on the top substrate surface, and further comprising an electrically conductive interconnection layer overlying the insulating layer and electronically interconnecting the microstrip reference plane and the substrate window metallization layer.

31. The package of claim 25 further comprising a first stripline reference plane on the waveguide material, and further comprising a second stripline reference plane over at least a portion of the electrically conductive interconnection layer.

32. The package of claim 25 wherein (a) comprises a substrate comprising a first stripline reference plane patterned thereon, and further comprising a second stripline reference plane over at least a portion of the electrically conductive interconnection layer.

33. The package of claim 32 wherein the insulating layer has a plurality of vias with at least one via extending to the first stripline reference plane and at least one via extending to a portion of the window metallization layer situated on the top substrate surface.

34. The package of claim 20 further comprising an electronic device positioned within the at least one window of the substrate active-side up, and wherein the via comprises a plurality of vias, including vias exposing bond pads of the electronic device, and further comprising an electrically conductive interconnection layer overlying the insulating layer and electronically interconnecting the exposed bond pads of the electronic and optical devices.

35. The package of claim 34 further comprising a heat sink attached to a surface of the substrate opposite the top substrate surface.

36. The package of claim 35 wherein the electronic device comprises a multichip module.

37. An optoelectronic package comprising:
(a) a substrate having windows;
(b) an optical device positioned within a first window of the substrate active-side up and below a top substrate surface;
(c) an electronic device positioned within a second window of the substrate active-side up and below the top substrate surface;
(d) an optical polymer material surrounding the optical device within the first window and having a planar surface with respect to the top substrate surface;
(e) filler material surrounding the electrical device within the second window and having a planar surface with respect to the top substrate surface;
(f) waveguide material patterned over the optical polymer material, filler material, and the substrate and forming an optical interconnection path and a mirror configured for reflecting light from the optical device to the interconnection path;
(g) an insulating layer over the patterned waveguide material, the insulating layer and waveguide material having vias extending therethrough towards bond pads of the electrical and optical devices; and
(h) an electrically conductive interconnection layer extending over the insulating layer and into the vias.

38. The package of claim 37 further comprising a protective metallization layer over the mirror.

39. The package of claim 37 further comprising an opening in the insulating layer exposing at least a portion of the mirror.

40. The package of claim 37 wherein the substrate comprises a window metallization layer extending at least partially on a bottom surface of the at least one window and the top substrate surface and wherein the optical device at least partially overlies the window metallization layer, wherein at least one of the vias extends to a portion of the window metallization layer situated on the top substrate surface.

41. The package of claim 40 wherein the window comprises a tapered ramp extending between the optical device and the portion of the top substrate surface underlying the window metalization layer.

42. The package of claim 41 wherein the substrate comprises a shallow recess in the top substrate surface in which the window metallization layer is situated.

43. The package of claim 40 further comprising a microstrip reference plane over the waveguide material, wherein at least one of the vias extends to the microstrip reference plane.

44. The package of claim 37 further comprising a heat sink attached to a surface of the substrate opposite the top substrate surface.

45. The package of claim 37 wherein the electronic device comprises a multichip module.

46. An optoelectronic package comprising:
(a) a substrate having a window and comprising a window metallization layer extending at least partially on a bottom surface of the window and a top substrate surface;
(b) an optical device positioned within the window active-side up and below the top substrate surface at least partially overlying the window metallization layer;
(c) an optical polymer material surrounding the optical device within the window and having a planar surface with respect to the top substrate surface;
(d) waveguide material patterned over the optical polymer material and the substrate and forming an optical interconnection path and a mirror configured for reflecting light from the optical device to the interconnection path;
(e) a microstrip reference plane over the waveguide material;
(f) an insulating layer over the waveguide material and microstrip reference plane, the insulating layer and waveguide material having vias extending therethrough towards bond pads of the electrical and optical devices, the window metallization layer, and the microstrip reference plane; and
(g) an electrically conductive interconnection layer extending over the insulating layer and into the vias.

47. The package of claim 46 further comprising a protective metallization layer over the mirror.

48. The package of claim 46 further comprising an opening in the insulating layer exposing at least a portion of the mirror.

49. The package of claim 46 further comprising a solder configured for coupling the optical device and the substrate.

50. The package of claim 49 further comprising a heat sink attached to a surface of the substrate opposite the top substrate surface.

51. The package of claim 46 wherein the window comprises a tapered ramp extending between the optical device and the portion of the top substrate surface underlying the window metalization layer.

52. The package of claim 50 wherein the substrate comprises a shallow recess in the top substrate surface in which the window metallization layer is situated.

53. An optoelectronic package comprising:
(a) a substrate having a window and comprising a window metallization layer extending at least partially on a bottom surface of the window and a top substrate surface and a first stripline reference plane patterned on the substrate;
(b) an optical device positioned within the window active-side up and below the top substrate surface at least partially overlying the window metallization layer;
(c) an optical polymer material surrounding the optical device within the window and having a planar surface with respect to the top substrate surface;
(d) waveguide material patterned over the optical polymer material and the substrate and forming an optical interconnection path and a mirror configured for reflecting light from the optical device to the interconnection path;
(e) an insulating layer over the waveguide material, the insulating layer and waveguide material having vias extending therethrough towards bond pads of the electrical and optical devices, the window metallization layer, and the first stripline reference plane;
(f) an electrically conductive interconnection layer extending over the insulating layer and into the vias; and
(g) a second stripline reference plane patterned over the waveguide material.

54. The package of claim 53 further comprising a protective metallization layer over the mirror.

55. The package of claim 53 further comprising an opening in the insulating layer exposing at least a portion of the mirror.

56. The package of claim 53 further comprising a solder configured for coupling the optical device and the substrate.

57. The package of claim 53 further comprising a heat sink attached to a surface of the substrate opposite the top substrate surface.

58. The package of claim 53 wherein the window comprises a tapered ramp extending between the optical device and the portion of the top substrate surface underlying the window metalization layer.

59. The package of claim 58 wherein the substrate comprises a shallow recess in the top substrate surface in which the window metallization layer is situated.

60. An optoelectronic package comprising:
(a) a substrate having windows, a first window having a window metallization layer extending at least partially on a bottom surface of the first window and a top substrate surface;
(b) an optical device positioned within the first window active-side up and below the top substrate surface at least partially overlying the window metallization layer;
(c) a multichip module positioned within a second window of the substrate active-side up and below the top substrate surface;
(d) an optical polymer material surrounding the optical device within the first window and having a planar surface with respect to the top substrate surface;
(e) filler material surrounding the electrical device within the second window and having a planar surface with respect to the top substrate surface;
(f) waveguide material patterned over the optical polymer material, filler material, and the substrate and forming an optical interconnection path and a mirror configured for reflecting light from the optical device to the interconnection path;
(g) a microstrip reference plane over the waveguide material;
(h) an insulating layer over the patterned waveguide material and the microstrip reference plane, the insulating layer and waveguide material having vias extending therethrough towards bond pads of the multichip module and the optical device, the window metallization layer, and the microstrip reference plane; and
(i) an electrically conductive interconnection layer extending over the insulating layer and into the vias.

61. The package of claim 60 further comprising a protective metallization layer over the mirror.

62. The package of claim 60 further comprising an opening in the insulating layer exposing at least a portion of the mirror.

63. The package of claim 60 further comprising a heat sink attached to a surface of the substrate opposite the top substrate surface.

64. The package of claim 60 further comprising a solder configured for coupling the optical device and the substrate.

65. The package of claim 60 wherein the window comprises a tapered ramp extending between the optical device and the portion of the top substrate surface underlying the window metalization layer.

66. The package of claim 65 wherein the substrate comprises a shallow recess in the top substrate surface in which the window metallization layer is situated.

* * * * *